United States Patent
Ferranti et al.

(10) Patent No.: US 6,709,554 B2
(45) Date of Patent: Mar. 23, 2004

(54) METHOD AND APPARATUS FOR REPAIRING LITHOGRAPHY MASKS USING A CHARGED PARTICLE BEAM SYSTEM

(75) Inventors: David C. Ferranti, Concord, MA (US); Sharon M. Szelag, Lynnfield, MA (US); J. David Casey, Jr., West Roxbury, MA (US)

(73) Assignee: FEI Company, Hillsboro, OR (US)

(*) Notice: Subject to any disclaimer, the term of this patent is extended or adjusted under 35 U.S.C. 154(b) by 280 days.

(21) Appl. No.: 09/802,342

(22) Filed: Mar. 9, 2001

(65) Prior Publication Data

US 2001/0027917 A1 Oct. 11, 2001

Related U.S. Application Data

(63) Continuation-in-part of application No. 09/522,561, filed on Mar. 10, 2000, now Pat. No. 6,322,672.

(51) Int. Cl.$^7$ .............................. C23C 14/34; C23F 1/00
(52) U.S. Cl. ........................... 204/192.34; 204/192.35; 216/66
(58) Field of Search ..................... 204/192.34, 192.35; 216/66

(56) References Cited

U.S. PATENT DOCUMENTS

| | | | |
|---|---|---|---|
| 3,699,334 A | 10/1972 | Cohen et al. | 250/49.5 TE |
| 4,874,460 A | 10/1989 | Nakagawa et al. | 156/626 |
| 5,228,501 A | 7/1993 | Tepman et al. | 118/728 |
| 5,851,413 A | 12/1998 | Casella et al. | 216/92 |
| 5,958,799 A | 9/1999 | Rusell et al. | 438/712 |
| 6,042,738 A | 3/2000 | Casey, Jr. et al. | 216/66 |
| 6,211,527 B1 | 4/2001 | Chandler | 250/492.2 |
| 6,322,672 B1 | 11/2001 | Shuman et al. | 204/192.34 |

*Primary Examiner*—Rodney G. McDonald
(74) *Attorney, Agent, or Firm*—Michael O. Scheinberg

(57) ABSTRACT

A method of repairing opaque defects in lithography masks entails focused ion beam milling in at least two steps. The first step uses a large pixel spacing to form multiple holes in the defect material, with the milled area extending short of the defect material edge. The final step uses a pixel spacing sufficiently close to produce a smooth floor on the milled area, and extends to the edge of the defect. During the second step, an etch enhancing gas such as bromine is preferably used.

17 Claims, 3 Drawing Sheets

METHOD AND APPARATUS FOR REPAIRING LITHOGRAPHY MASKS USING A CHARGED PARTICLE BEAM SYSTEM

This application is a continuation-in-part of U.S. patent application Ser. No. 09/522,561, filed Mar. 10, 2000 now U.S. Pat. No. 6,322,672.

TECHNICAL FIELD OF THE INVENTION

The present invention relates to the field of charged particle beam processing and, in particular, to a method and apparatus for removing material from a semiconductor lithography mask.

BACKGROUND AND SUMMARY OF THE INVENTION

Focused ion beam (FIB) systems are widely used in microscopic-scale manufacturing operations because of their ability to image, etch, mill, deposit, and analyze with great precision. Ion columns on FIB systems using gallium liquid metal ion sources (LMIS), for example, can provide five to seven nanometer lateral imaging resolution. Because of their versatility and precision, FIB systems have gained universal acceptance in the integrated circuit (IC) industry as necessary analytical tools for use in process development, lithography mask repair, failure analysis, and defect characterization.

One step in the fabrication of integrated circuits entails the use of lithography. A semiconductor substrate on which circuits are being formed is typically coated with a material, such as a photoresist, that changes solubility when exposed to radiation. A lithography tool, such as a mask or reticle, positioned between the radiation source and the semiconductor substrate casts a shadow to control which areas of the substrate are exposed to the radiation. After the exposure, the photoresist is removed from either the exposed or the unexposed areas, leaving a patterned layer of photoresist on the wafer that protects parts of the wafer during a subsequent etching or diffusion process.

The term mask is used generically herein to refer to any lithography tool, regardless of the type of exposing radiation and regardless of whether the image of the mask is printed once or stepped across the substrate. A mask typically comprises a patterned layer of an absorber material, such as chromium or molybdenum silicide, on a substrate, such as quartz. When the pattern is formed on the mask, it is not unusual for the mask to have defects, such as having absorber material deposited in areas that should be clear, or having absorber missing from areas that should be opaque. The high resolution of FIB systems make them ideal for removing absorber from areas of a mask that should be clear.

The use of a FIB system for removing opaque material from a mask is described, for example, in U.S. Pat. No. 6,042,738 to Casey et al. for "Pattern Film Repair Using a Focused Particle Beam System," which is assigned to FEI Company, Hillsboro, Oreg. the assignee of the present invention. FEI Company manufactures focused ion beam systems, such as the Model 800 Series FIB Systems, that have software specifically for facilitating mask repair.

When using a FIB system to remove opaque material from a mask, the mask is positioned on a stage that is maneuvered, for example, using positional information from a previous inspection, so that the defect is within the area scanned by the ion beam. The beam then scans the surface of the area around the defect to produce an image. The defect area is identified and the ion beam current is increased to remove the opaque material.

Ideally, after removal of inadvertently deposited absorber material, the substrate area from which the defect material was removed should have the same characteristics as the area would have had if the area had been manufactured without the defect. Unfortunately, the removal process incidentally and unavoidably changes the properties of the substrate. For example, in a photolithography mask that uses a chromium absorber on a quartz substrate, the quartz at the location where the defect was removed typically loses some of its transparency. This loss is particularly severe for the very short exposing light wavelengths used in modern photolithography tools, with the loss of transparency, typically being between 3 percent and 10 percent.

Overetching, particularly at the edges of the repair, is a primary factor in the loss of transparency. This phenomenon is known as "riverbedding" because the etched edges resemble riverbeds when viewed with an electron microscope. One approach to minimizing the riverbed effect to first remove the center portion of the opaque defect, and then apply a lower ion dose to the outside edges to complete the repair. This technique is known as a "framed repair." The 800 Series FIB System from FEI Company can perform a framed repair to the operator's specification. Even when using a framed repair, riverbeds are typically about 20 nm deep.

Other factors thought to contribute to loss of transparency include the implantation of gallium from the ion beam into the quartz substrate and damage to the quartz itself, due to etching past the chromium or due to crystalline damage cause by impact of the heavy gallium ions. U.S. Pat. No. 6,042,738 describes using a clean-up gas with the focused ion beam to improve the transparency of the substrate after removing an opaque defect.

SUMMARY OF THE INVENTION

An object of the invention, therefore, is to remove material from a substrate while minimizing or eliminating changes in characteristics of the substrate.

Applicants have discovered that the effects on a substrate of the focused ion beam removal of material on the substrate is minimized if the ion beam moves initially in a pattern that produces a uneven surface. For example, the beam could move in a pattern in which the sample is milled at a series of non-contiguous points to produce a series of holes, rather than moving in a conventional pattern of overlapping pixels. In a subsequent milling step, the beam moves in a pattern, such as a pattern of overlapping or nearly overlapping pixels, to produce a relatively uniform, planar surface. During the subsequent milling step, an etch enhancing gas is preferably used.

The present invention decreases the size of riverbeds and provides increased substrate transparency at the repaired area compared to prior art repair methods. In some embodiments, the invention reduced the amount of time that the mask needed to be under the ion beam, thereby improving production rates.

The invention is not limited to any particular type of mask or substrate materials, although the benefits of the invention are particularly apparent in milling chromium on a quartz substrate.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF PREFERRED EMBODIMENTS

Figure 1:
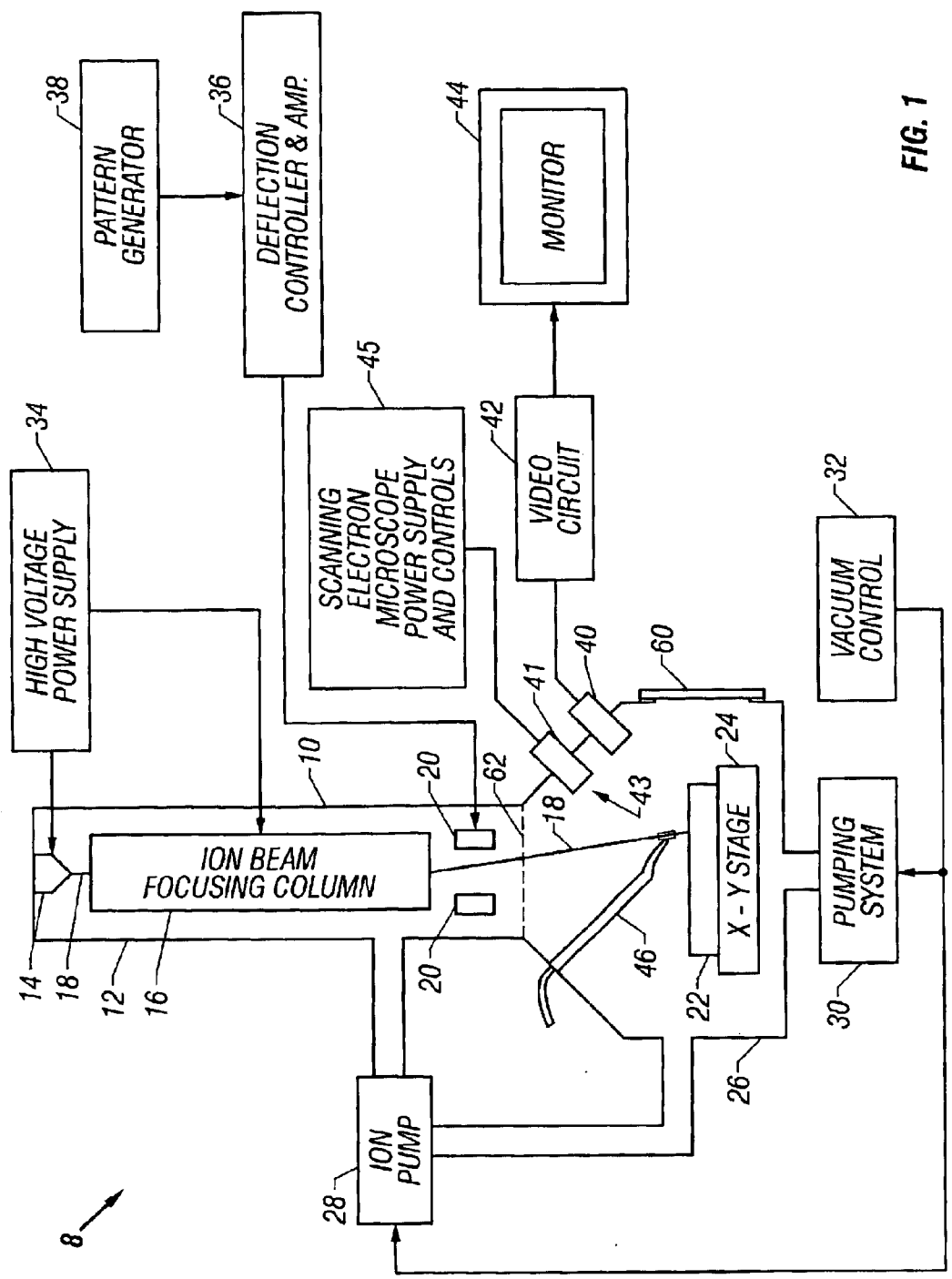
FIG. 1 shows schematically a typical focused ion beam system used in a preferred embodiment of the invention.

In FIG. 1, a focused ion beam system 8 includes an evacuated envelope 10 having an upper neck portion 12 within which are located a liquid metal ion source 14 and a focusing column 16 including extractor electrodes and an electrostatic optical system. Ion beam 18 passes from source 14 through column 16 and between electrostatic deflection means schematically indicated at 20 toward sample 22, which comprises, for example, a photolithography mask positioned on movable X-Y stage 24 within lower chamber 26. An ion pump 28 is employed for evacuating neck portion 12. The chamber 26 is evacuated with turbomolecular and mechanical pumping system 30 under the control of vacuum controller 32. The vacuum system provides within chamber 26 a vacuum of between approximately $1 \times 10^{-7}$ Torr and $5 \times 10^{-4}$ Torr. When an etch-assisting or an etch retarding gas is used, the chamber background pressure is typically about $1 \times 10^{-5}$ Torr.

High voltage power supply 34 is connected to liquid metal ion source 14 as well as to appropriate electrodes in focusing column 16 for forming an approximately 1 keV to 60 keV ion beam 18 and directing the same downwardly. Deflection controller and amplifier 36, operated in accordance with a prescribed pattern provided by pattern generator 38, is coupled to deflection plates 20 whereby beam 18 may be controlled to trace out a corresponding pattern on the upper surface of sample 22. The pattern to be traced is described in detail below. In some systems the deflection plates are placed before the final lens, as is well known in the art.

The source 14 typically provides a metal ion beam of gallium, although other ion sources, such as a multicusp or other plasma ion source, can be used. The source typically is capable of being focused into a sub one-tenth micron wide beam at sample 22 for either modifying the surface 22 by ion milling, enhanced etch, material deposition, or for the purpose of imaging the surface 22. An charged particle multiplier 40 used for detecting secondary ion or electron emission for imaging is connected to video circuit and amplifier 42, the latter supplying drive for video monitor 44 also receiving deflection signals from controller 36. The location of charged particle multiplier 40 within chamber 26 can vary in different embodiments. For example, a preferred charged particle multiplier 40 can be coaxial with the ion beam and include a hole for allowing the ion beam to pass. A scanning electron microscope 41, along with its power supply and controls 45, are optionally provided with the FIB system 8.

A fluid delivery system 46 optionally extends into lower chamber 26 for introducing and directing a gaseous vapor toward sample 22. U.S. Pat. No. 5,851,413 to Casella et al. for "Gas Delivery Systems For Particle Beam Processing," assigned to the assignee of the present invention, describes a suitable fluid delivery system 46.

A door 60 is opened for inserting sample 22 on stage 24 which may be heated or cooled, and also for servicing the reservoir 50. The door is interlocked so that it cannot be opened if the system is under vacuum. The high voltage power supply provides an appropriate acceleration voltage to electrodes in ion beam column 16 for energizing and focusing ion beam 18. When it strikes the sample, material is sputtered, that is physically ejected, from the sample. Focused ion beam systems are commercially available, for example, from FEI Company, Hillsboro, Oreg., the assignee of the present application.

In a preferred embodiment of the present invention, signals applied to deflection controller and amplifier 36 cause the focused ion beam to move within a defect area on a mask in a manner that reduces the effect of the repair on the mask.

Figure 2:
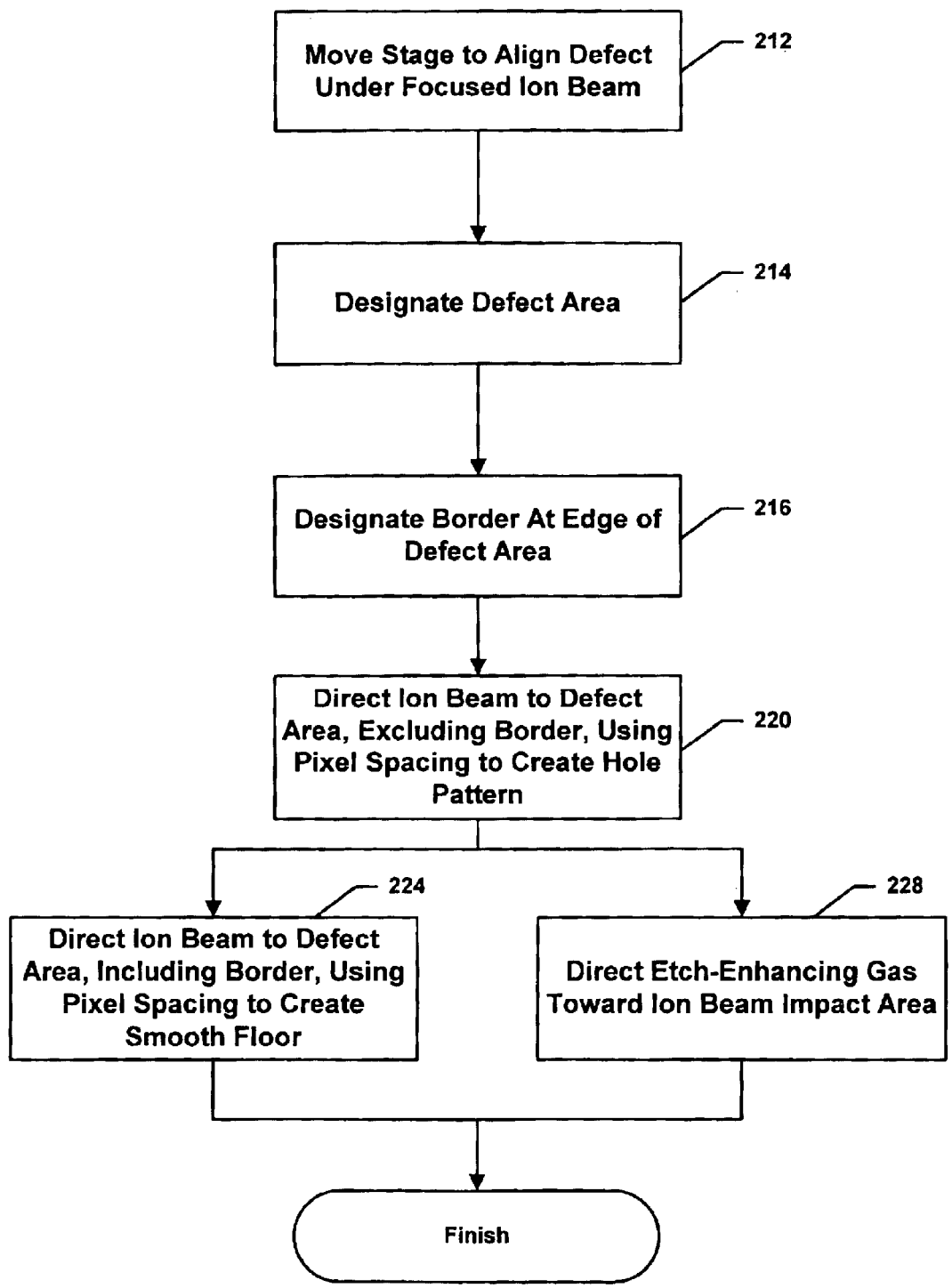
FIG. 2 is a flow chart showing a preferred method of the present invention.

FIG. 2 is a flow chart showing steps of a preferred embodiment of the present invention. Step 212 shows that the stage is moved or navigated so that the defect is under the ion beam. In step 214, a defect area is designated. Various techniques can be used to designate the defect area. For example, in an FEI Accura Series FIB system using the IntuitION™ software, the defect area is designated by first drawing a box on the display that includes both the opaque defect and clear, non-defect areas. The opaque areas appear brighter on the display screen, because the secondary electron current coming from the chromium area is greater than the secondary electron current coming from the quartz areas. To designate the defect area, the system automatically identifies the defective, opaque area by the larger secondary electron current. If necessary, the system operator can adjust the threshold used by the system to differentiate between defect and clear areas, and can also manually adjust the designated defect area. The IntuitION™ software includes an "Edge Lock" feature that will automatically align an edge of the designated defect area with a reference edge of opaque material, so that the repair will remove material up to, but not past the reference edge.

Figure 3:
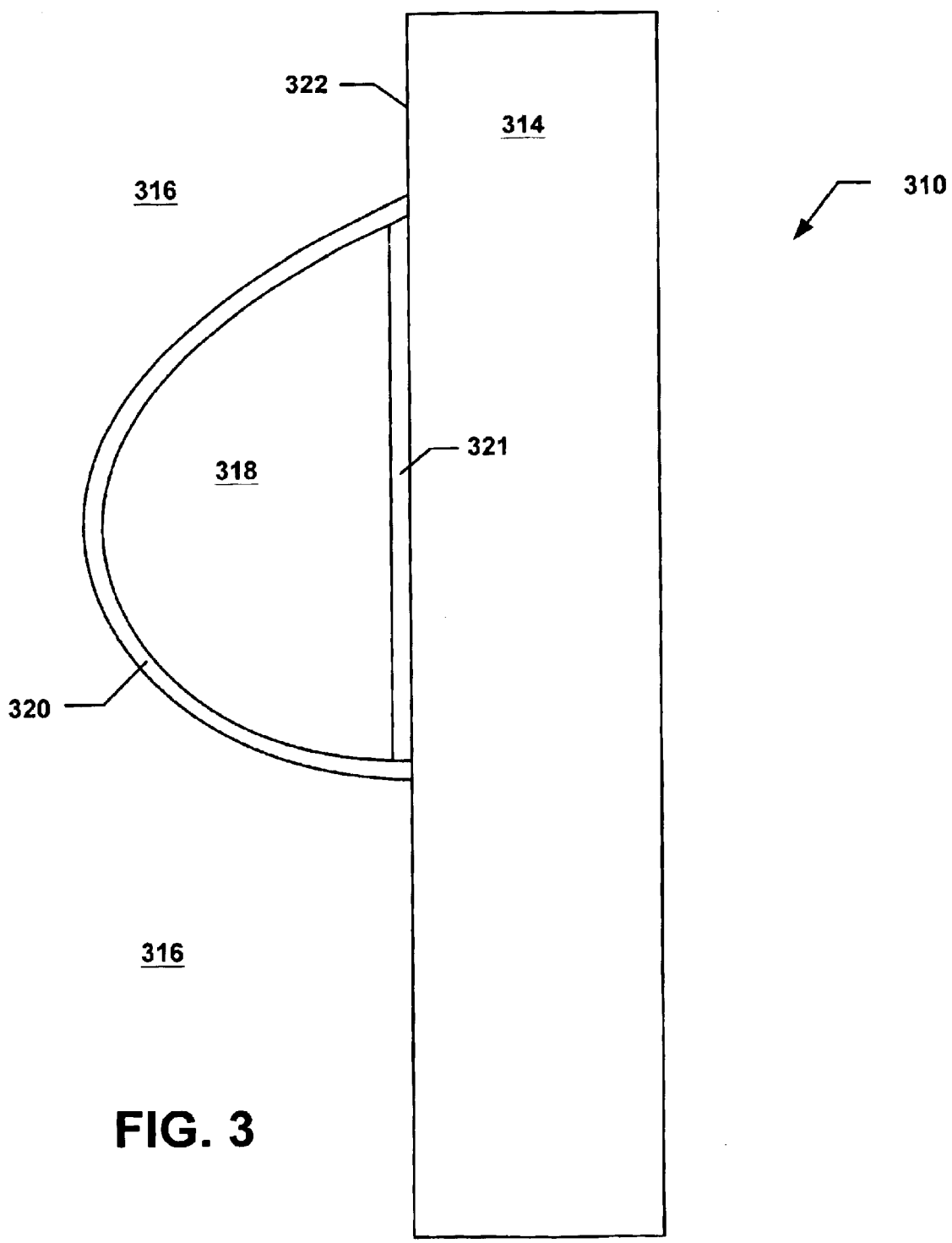
FIG. 3 shows a portion of a mask, greatly enlarged, having an opaque defect.

In step 216, a "frame" or border is designated within the defect area. The frame preferably has a width of about two pixels, although the preferred width of the frame may vary with the mask construction. FIG. 3 shows an enlarged portion of a mask 310 having an opaque region 314, a clear region 316, and an opaque defect region 318, with a frame area 320 designated within opaque defect region 318. The IntuitION™ software allows the operator to set a frame width. If the Edge Lock feature was used, a Edge Lock Factor of, for example, −0.1, can be used to provide a similar border area 321 adjacent to a reference edge 322.

In step 220, the ion beam is directed to the defect region 318, excluding the frame area 320 and 321, to begin removing the defect and to produce an uneven surface. In a preferred embodiment, the pixel or dwell point spacing in step 220 is greater than the beam spot size to produce a series of holes in defect region 318. The pixel spacing is preferably between about 2 and 15 times the beam diameter or spot size, measured as the diameter at which the beam intensity falls to fifty percent of the maximum intensity. For example, pixel spacings of between 75 nm and 175 nm were used successfully with a preferred 35 nm beam diameter, although the preferred spacing will depend upon the application.

The pixel spacing should preferably be such as to provide a hilly texture to the milled surface, that is, not so great that large flat areas remain and not so small that the milled area is flat after step 220. Experimental results show the transparency of the repaired area is not particularly sensitive to the exact pixel spacing used. Because the ion beam intensity typically has a Gaussian or "bell-shaped" current density distribution, the holes are also Gaussian shaped, and the peaks of the regions between the holes may also be milled so that they are lower than their height before step 220.

Step 220 produces an uneven surface, that is, a surface with topography variations significant enough to enhance ion beam milling. The minimum level of unevenness can vary with the thickness and type of the material being milled. The preferred variation in surface topography is greater than 50 nm and more preferably greater than 70 nm.

The ion beam spot size can be increased to about 0.15 µm for some implementations, and beams as large as 0.8 µm or larger can be achieved if desired. If the Framed Repair option in the IntuitION™ software was used, it is necessary to cancel the repair after milling the interior of defect 318 so that the frame 320 is not milled in step 220.

The milling in step 220 is preferably performed without the use of an etch-assisting gas. By not using a gas in step 220, the time interval at which the ion beam can return to each pixel, that is, the refresh time, can be decreased because it is unnecessary to wait for additional gas molecules to be adsorbed onto the substrate surface. The ion beam dwell time can also be increased, because it is not limited by the amount of adsorbed gas available at the dwell point. The repair time can therefore be significantly reduced. In one test, repair time was reduced by fifteen percent.

In step 220, the holes in the chromium were milled to between about seventy percent and about ninety percent of the chromium thickness. It is desirable to mill a large portion of the chromium depth in step 220 because milling is relatively rapid, but the depth of milling should not be so great that the chromium is thinned to a point at which a significant amount of gallium is implanted in the substrate. A value in the of 50% to 95% of the depth may be useful in many applications, and a value outside this range may be useful in some applications. The optimum pixel spacing and depth of milling in step 220 will depend on the beam size and properties of the mask, such as the absorber and substrate materials and the thickness of the absorber.

In step 224, the ion beam is directed to pixels within the entire defect area, including frame area 320 and 321 using a pixel spacing sufficiently small to produce a smooth floor on the milled area. If the Edge Lock feature is used, the Edge Lock Factor is now set to zero so that the milling extends to the reference edge 322. While the ion beam is applied in step 224, an etch-enhancing gas is preferably directed to the impact area of the ion beam to assist in milling. Etch enhancing gases may include halogens and are typically specific to the particular material being etched. A preferred etch enhancing gas for etching chromium comprises molecular bromine. Xenon-difluoride would be suitable for etching MoSiON and other attenuating materials well. Water vapor can be added to the bromine or other etchant, preferably at a 10:1 molar ratio of bromine to water, to reduce quartz etching.

One or more additional intermediate milling steps can be used between step 220 and step 224. The intermediate steps typically use a pixel spacing between that of step 220 and that of step 224. If multiple intermediate steps are used, the pixel spacing typically decreases with each subsequent step. Some of the holes milled in the various steps will typically overlap previously milled holes. Upon finishing the multiple steps, however, the amount of material removed from each point in the sample is approximately equal to produce a relatively uniform, planar floor over the entire area milled.

In both steps 220 and 224, the ion beam moves between pixel locations, dwelling at each pixel location for a predetermined dwell time, and returning to each location periodically until a prescribed ion dose has been delivered. The same pixel spacing and dosages are typically used for defects of various sizes, although these parameters, as well as other beam settings, can be changed for different applications. Both steps preferably employ a 75 µm aperture in the ion optical column and use a 35 pA beam current. In both steps, the beam preferably moves in a serpentine pattern, that is, the scanning direction is reversed at the end of each row scanned.

In one preferred embodiment, the beam dwells at each pixel location for approximately 500 µsec during step 220, and the minimum refresh time, that is, the minimum time permitted for the beam to return to a given pixel location in a subsequent scan, is set to about 10 µsec thereby minimizing the delay between rasters. In step 224, the pixel spacing is about 0.04 µm, and the dwell time is about 0.35 µsec. The refresh time is increased to about 6000 µsec to allow time for gas molecules to adsorb between successive rasters. In step 224, the operation can be programmed to pause after specified percentages, such as 40%, 60%, 80% or 90%, of the ion dose is delivered. This pause allows the system operator to view the progress of the repair and to ensure that the repair operation does not etch significantly into the substrate after the defect material is removed. In some embodiments, SIMS can be used to analyze the material being sputtered from the mask to determine when the absorber material has been removed.

Applicants used the technique for several repairs on typical photolithography masks comprising a quartz substrate and a chromium layer 100 nm thick as the absorber. Table 1 shows the FIB system parameters used for step 220. Table 2 shows the FIB system parameters used for step 224. Table 3 shows the different pixel spacings and the depth of milling in step 220 relative to the total chromium thickness and the measured transparency and depth of the overetching at the edge of the repair, that is, "riverbedding."

TABLE 1

Constants for Step 220

| Parameter | Setting |
| --- | --- |
| Aperture | 75 um |
| Beam Current | 35 pA |
| Dwell time | 500 µsec |
| Retrace | 10 µsec |
| Min. Refresh | 10 µsec |
| Gas | None |
| Technique | Frames-Dose to Frame = 0.0 |
| | Frame width = 2x Pixel Spacing |
| | Edge Lock Factor = −0.1 |

TABLE 2

Constants for Step 224

| Parameter | Setting |
| --- | --- |
| Aperture | 75 um |
| Beam Current | 35 pA |
| Pixel Spacing | 0.04 µm |
| Dwell time | 0.35 µsec |
| Retrace | 10 µsec |
| Min. Refresh | 6000 µsec |
| Gas | Br Only-HCIG 1.8 e$^{-5}$ |
| Technique | Intervals-0.40, 0.60, 0.80, 0.90 |
| | Edge Lock = 0.0 |

TABLE 3

| | Pixel Spacing (nm) | Depth (% Cr) | Actual Ion Dose (nC/$\mu$m$^2$) | Edge (nm) | Through Transparency (%) AIMS | Transverse Transparency (%) AIMS | Riverbed Min Depth (nm) | Riverbed Max Depth (nm) |
|---|---|---|---|---|---|---|---|---|
| 1 | 175 | 0.8 | 0.106 | 3.3 | 99.3 | 99 | 10 | −2 |
| 2 | 175 | 0.9 | 0.119 | 4.5 | 96.7 | 96.7 | −2 | −10 |
| 3 | 125 | 0.9 | 0.14 | 9.9 | 98.8 | 96.9 | −13 | −25 |
| 4 | 100 | 0.8 | 0.246 | 28.3 | 97.6 | 95.1 | −7 | −30 |
| 5 | 150 | 0.8 | 0.114 | 17.7 | 98.6 | 95.9 | −5 | −12 |
| 6 | 150 | 0.9 | 0.129 | 12 | 98.1 | 95.5 | −8 | −17 |
| 7 | 100 | 0.9 | 0.277 | 4.2 | 98.4 | 95.4 | −1 | −20 |
| 8 | 75 | 0.7 | 0.328 | −5.7 | 97.8 | 95.5 | −7 | −17 |
| 9 | 100 | 0.7 | 0.216 | 19.2 | 97.8 | 96.1 | 4 | −4 |
| 10 | 75 | 0.9 | 0.422 | 15 | 98 | 93.8 | −13 | −14 |
| 11 | 125 | 0.8 | 0.124 | 24.2 | 97.7 | 94.9 | −2 | −7 |
| 12 | 75 | 0.8 | 0.375 | 3 | 98.8 | 95.7 | −2 | −2 |
| 13 | 175 | 0.7 | 0.092 | 34 | 96.7 | 95.2 | 9 | 11 |
| 14 | 150 | 0.7 | 0.1 | 5.4 | 97 | 93.4 | 1 | 1 |
| 15 | 125 | 0.7 | 0.109 | −22.2 | 99 | 93.6 | 2 | −8 |

The transparencies were measured using light having a wavelength of 248 nm in an Aerial Image Measurement System (AIMS), and riverbed depths were measured using an atomic force microscope (AFM). "Through transparencies" were measured through the repaired region along a line perpendicular to the adjacent, non-defect, chromium line (e.g., line 322 of FIG. 3), and "transverse transparencies" were measured along a line parallel to the adjacent, non-defect, chromium line, through the repaired region. Positive values for riverbedding indicate residual material on the substrate, whereas negative values indicate a true riverbed or depressed area.

Riverbeds well under 20 nm were achieved, with riverbeds below 15 nm, below 10 nm, and even below 5 nm in many cases. Through transparencies were all greater than 95%, with most greater than 96% or 97%, and several greater than 98%. The "Edge" column of Table 3 indicates how closely the edge of the clear repaired region aligns with its intended edge, for example, line 322 of FIG. 3. The edge value is positive if the chromium line adjacent to the repaired area is thicker that the same line away from repaired area and negative if the chromium line adjacent to the repaired area is thinner. In step 224, the chamber pressure was measured with a Hot Cathode Ionization Gauge (HGIG) to be 1.8×10$^{-5}$ Torr. Applicants believe that the increase in transparency derives primarily from the reduction of riverbeds, rather than from reduced gallium implantation.

Applicants have also found that the milling specifications, that is, the pixel spacing, dose, ion energy, beam size, and other parameters, of each milling step box, as well as the number of steps used, may be varied to optimize milling depending on the mask characteristics, including the absorber material and thickness. The specification of each milling box and the number of boxes can be determined experimentally using the example and information provided above as a guide.

Although in the patterns described above, the milling is being performed in rectangular arrays of fixed pixel spacings within each box, the invention is not limited to that embodiment. For example, the pixel spacing can be gradually reduced, rather than being reduced in discrete steps, and the milling locations do not need to be distributed in a rectangular or regular pattern, so long as the pixels are spaced widely enough to preserve transparency and the amount of material eventually removed from each point is about the same to produce a flat, smooth, planar floor. The pixel spacing could even remain unchanged, with the pixel locations changing in subsequent scans to produce a flat, smooth, planar floor.

Although the invention has been described with respect to mask repair, it could be used in any application in which it is desired to remove material with minimal effect on the underlying material.

Where this application refers to removal of opaque material, it is intended to include other materials, such as phase-shifting materials, used on a mask.

Although the present invention and its advantages have been described in detail, it should be understood that various changes, substitutions and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A method of repairing a defect area of a lithography mask using a focused ion beam having a beam diameter, the method comprising:

directing the focused ion beam toward first pixel locations in the defect area, the first pixel locations being separated by a first distance that is greater than the beam diameter; and directing the focused ion beam toward second pixel locations in the defect area, the second pixel locations being separated by a second distance, the second distance being less than the first distance and sufficiently small to produce a substantially flat surface.

2. The method of claim 1 further comprising directing a gas toward the defect area while directing the focused ion beam toward the second locations.

3. The method of claim 1 in which directing a gas toward the defect area includes directing a gas comprising bromine.

4. The method of claim 1 in which the first distance is greater than 1.5 times the beam diameter and less than fifteen times the beam diameter.

5. The method of claim 1 in which the first pixel locations do not extend to the edge of the defect area and the second pixel locations do extend to the edge of the defect area.

6. The method of claim 1 in which the defect area has an original thickness before milling, and in which directing the focused ion beam toward first pixel locations within the defect area includes directing the focused ion beam toward first pixel locations to remove material representing between fifty percent and ninety five percent of the original thickness.

7. The method of claim 6 in which removing material representing between fifty percent and ninety five percent of the original thickness includes removing material between seventy and ninety percent of the original thickness.

8. The method of claim 1 in which the area comprises an interior region and a boundary region and in which directing the focused ion beam toward first pixel locations in the defect area includes directing the focused ion beam toward first pixel locations in the interior region but not the boundary region.

9. The method of claim 8 in which the boundary region has an average width of less than five times the first distance.

10. The method of claim 1 further comprising directing the focused ion beam toward additional pixel locations in the defect area, the additional pixel locations being spaced apart by a distances less than the first distance and greater than the second distance.

11. The method of claim 1 in which the defect area comprises chromium.

12. A method of using a focused ion beam to remove material from an area of a substrate, comprising:

scanning an ion beam within the area to produce an uneven surface, but not within a boundary region at the edge of the area, said scanning an ion beam within the area to produce an uneven surface including directing the focused ion beam toward first pixel locations within the area, but not within a boundary region at the edge of but within the area, the first pixel location being separated by a first distance that is greater than the beam diameter;

scanning an ion beam within the area to produce a substantially flat surface, said scanning an ion beam within the area to produce a substantially flat surface including directing the focused ion beam toward second pixel locations within the area, the second pixel locations being separated by a second distance, the second distance being less than the first distance and sufficiently small to produce the substantially flat surface; and directing an etch enhancing gas toward the area while scanning the ion beam to produce a substantially flat surface.

13. The method of claim 12 in which the first distance is greater than 1.5 times the beam diameter and less than fifteen times the beam diameter.

14. The method of claim 12 in which the boundary region has a width less than five time the first distance.

15. The method of claim 12 in which the material being removed has an original thickness before milling, and in which directing the focused ion beam toward first pixel locations within the area, but not within a boundary region, includes directing the focused ion beam toward first pixel locations to remove material representing between fifty percent and ninety five percent of the original thickness.

16. The method of claim 15 in which removing material representing between fifty percent and ninety five percent of the original thickness includes removing material between seventy and ninety percent of the original thickness.

17. The method of claim 12 in which the material comprises chromium, the substrate comprises quartz, and the etch enhancing gas comprises bromine.

* * * * *